(12) United States Patent
Tagami

(10) Patent No.: US 12,218,088 B2
(45) Date of Patent: Feb. 4, 2025

(54) SEMICONDUCTOR DEVICE

(71) Applicant: Kioxia Corporation, Minato-ku (JP)

(72) Inventor: Masayoshi Tagami, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/894,219

(22) Filed: Aug. 24, 2022

(65) Prior Publication Data

US 2022/0406743 A1     Dec. 22, 2022

Related U.S. Application Data

(63) Continuation of application No. 16/952,205, filed on Nov. 19, 2020, now Pat. No. 11,462,496, which is a (Continued)

(30) Foreign Application Priority Data

Mar. 7, 2018   (JP) ................................. 2018-040790

(51) Int. Cl.
*H01L 23/00*      (2006.01)
*H01L 23/522*     (2006.01)
(Continued)

(52) U.S. Cl.
CPC .......... *H01L 24/08* (2013.01); *H01L 23/5226* (2013.01); *H01L 24/05* (2013.01);
(Continued)

(58) Field of Classification Search
CPC ..... H01L 24/08; H01L 23/5226; H01L 24/05; H01L 24/83; H01L 25/18; H01L 21/185;
(Continued)

(56) References Cited

U.S. PATENT DOCUMENTS

| | | | |
|---|---|---|---|
| 9,064,937 B2 | 6/2015 | Edelstein et al. | |
| 9,093,575 B2 | 7/2015 | Yokoyama | |

(Continued)

FOREIGN PATENT DOCUMENTS

| | | | |
|---|---|---|---|
| CN | 103715175 A | 4/2014 | |
| CN | 105580136 A | 5/2016 | |

(Continued)

*Primary Examiner* — Galina G Yushina
(74) *Attorney, Agent, or Firm* — Oblon, McClelland, Maier & Neustadt, L.L.P.

(57) ABSTRACT

In one embodiment, a semiconductor device includes a first chip including a substrate, a first plug on the substrate, and a first pad on the first plug, and a second chip including a second plug and a second pad under the second plug. The second chip includes an electrode layer electrically connected to the second plug, a charge storage layer provided on a side face of the electrode layer via a first insulator, and a semiconductor layer provided on a side face of the charge storage layer via a second insulator. The first and second pads are bonded with each other, and the first and second plugs are disposed so that at least a portion of the first plug and at least a portion of the second plug do not overlap with each other in a first direction that is perpendicular to a surface of the substrate.

4 Claims, 8 Drawing Sheets

Related U.S. Application Data continuation of application No. 16/126,034, filed on Sep. 10, 2018, now abandoned.

(51) Int. Cl.
*H01L 25/18* (2023.01)
*H10B 43/27* (2023.01)

(52) U.S. Cl.
CPC .............. *H01L 24/83* (2013.01); *H01L 25/18* (2013.01); *H10B 43/27* (2023.02); *H01L 2224/05557* (2013.01); *H01L 2224/0557* (2013.01); *H01L 2224/05647* (2013.01); *H01L 2224/05655* (2013.01); *H01L 2224/08059* (2013.01); *H01L 2224/0807* (2013.01); *H01L 2224/08148* (2013.01); *H01L 2224/80203* (2013.01); *H01L 2224/83203* (2013.01); *H01L 2224/83896* (2013.01)

(58) Field of Classification Search
CPC ......... H01L 21/187; H01L 2224/05557; H01L 2224/0557; H01L 2224/05647; H01L 2224/05655; H01L 2224/08059; H01L 2224/08148; H01L 2224/80203; H10B 43/27; H21L 2224/0807
See application file for complete search history.

(56) References Cited

U.S. PATENT DOCUMENTS

| | | | |
|---|---|---|---|
| 9,558,945 B2 | 1/2017 | Fukuzumi et al. | |
| 9,559,057 B1 | 1/2017 | Nishiwaki et al. | |
| 10,026,769 B2 | 7/2018 | Kagawa et al. | |
| 11,211,397 B2 | 12/2021 | Lu et al. | |
| 2004/0036131 A1 | 2/2004 | Farnworth | |
| 2006/0079008 A1* | 4/2006 | Nishimaki | B23K 20/007 438/11 |
| 2007/0145367 A1* | 6/2007 | Chen | H01L 25/50 257/E27.026 |
| 2014/0011324 A1* | 1/2014 | Liu | H01L 24/74 438/455 |
| 2014/0091321 A1* | 4/2014 | Yokoyama | H01L 27/14643 438/98 |
| 2014/0145338 A1 | 5/2014 | Fujii et al. | |
| 2016/0079164 A1* | 3/2016 | Fukuzumi | H01L 21/185 438/107 |
| 2016/0233264 A1* | 8/2016 | Kagawa | H01L 21/76898 |
| 2016/0293622 A1 | 10/2016 | Jeong et al. | |
| 2017/0179050 A1 | 6/2017 | Kariyazaki | |
| 2017/0373084 A1 | 12/2017 | Shim et al. | |
| 2018/0240797 A1* | 8/2018 | Yokoyama | H01L 23/528 |
| 2019/0279952 A1 | 9/2019 | Tagami | |

FOREIGN PATENT DOCUMENTS

| | | |
|---|---|---|
| CN | 107658315 A | 2/2018 |
| JP | 2011-054637 | 3/2011 |
| JP | 2014-72418 A | 4/2014 |
| JP | 2016-062901 | 4/2016 |
| JP | 2017-34156 A | 2/2017 |

\* cited by examiner

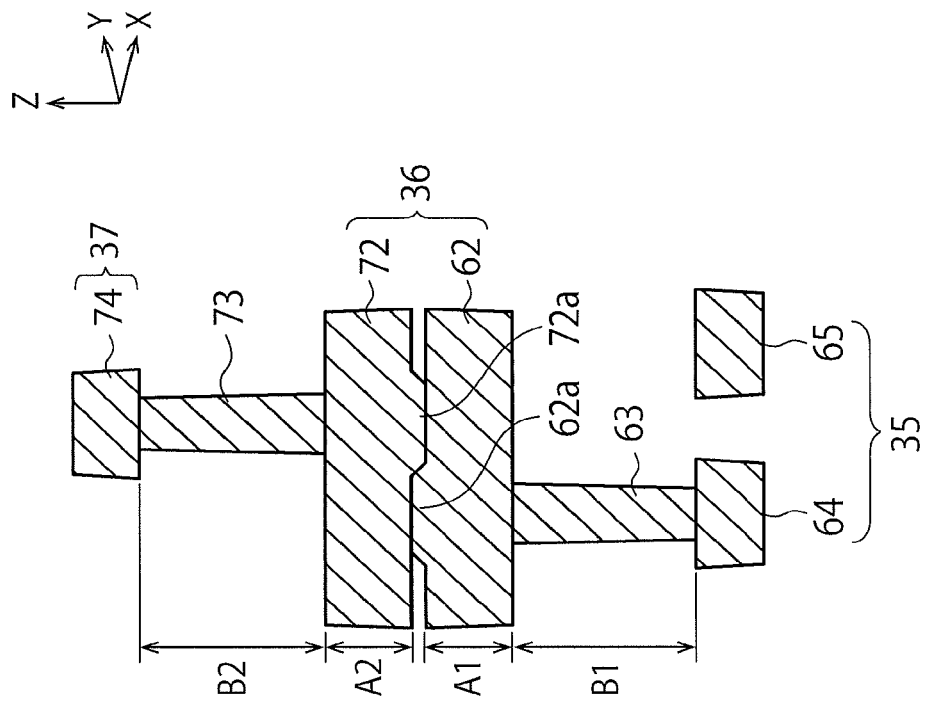
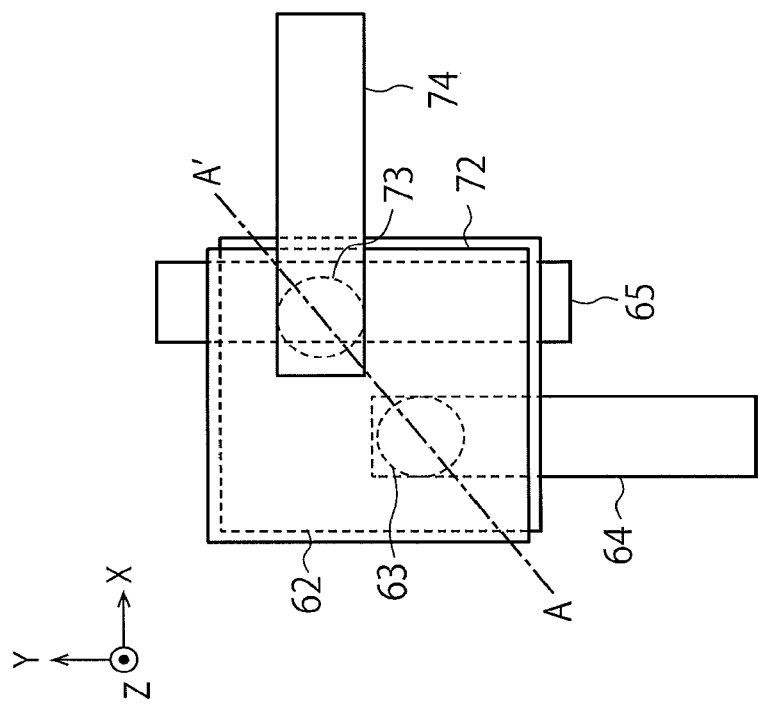
FIG. 4B
FIG. 4A

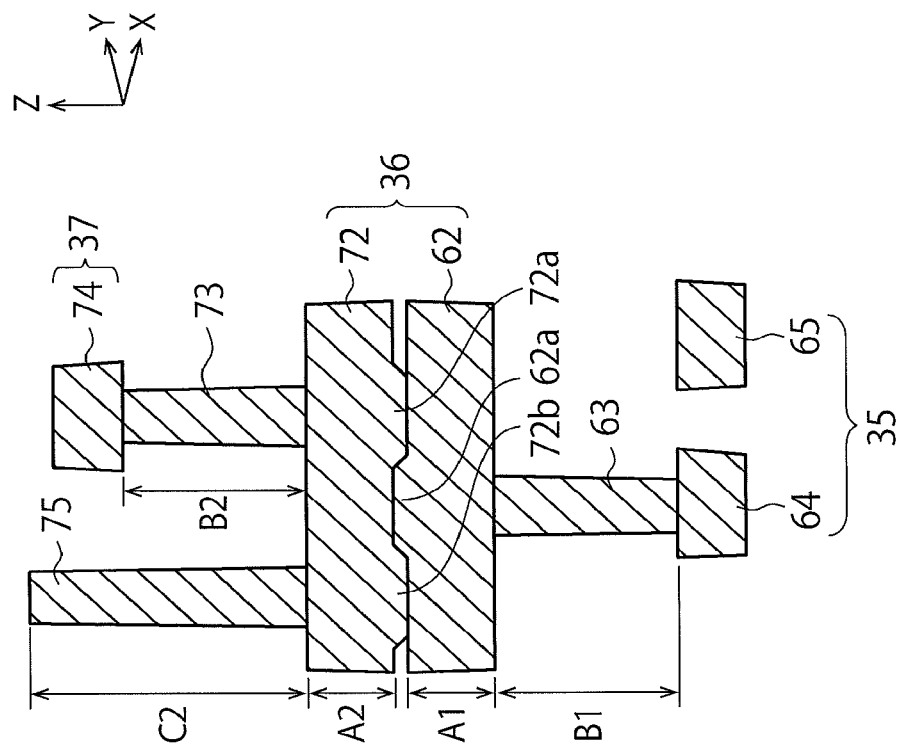
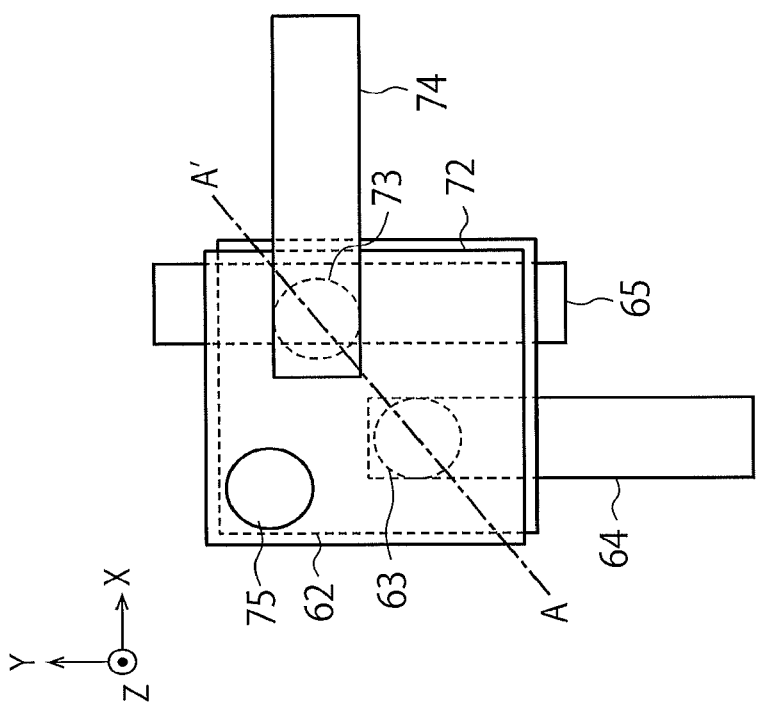
FIG. 7B
FIG. 7A

SEMICONDUCTOR DEVICE

CROSS REFERENCE TO RELATED APPLICATION

This application is a continuation of and claims the benefit of priority under 35 U.S.C. § 120 from U.S. application Ser. No. 16/952,205 filed Nov. 19, 2020, which is a continuation of U.S. application Ser. No. 16/126,034 filed Sep. 10, 2018, and claims the benefit of priority under 35 U.S.C. § 119 from Japanese Patent Application No. 2018-040790 filed Mar. 7, 2018, the entire contents of each of which are incorporated herein by reference.

FIELD

Embodiments described herein relate to a semiconductor device.

BACKGROUND

A semiconductor device such as a three-dimensional memory is sometimes manufactured by bonding a metal pad of a wafer to a metal pad of another wafer through a pasting process. In this case, there is a possibility that the metal pads are not appropriately bonded to each other due to misalignment of these metal pads or the like.

BRIEF DESCRIPTION OF THE DRAWINGS

FIGS. 4A and 4B are a cross-section view and a plan view for explaining the structure of the semiconductor device in the first embodiment;

FIGS. 7A and 7B are a cross-section view and a plan view for explaining a structure of a semiconductor device in a second embodiment.

DETAILED DESCRIPTION

Embodiments will now be explained with reference to the accompanying drawings.

In one embodiment, a semiconductor device includes a first chip including a substrate, a first plug provided on the substrate, and a first pad provided on the first plug, and a second chip including a second plug and a second pad provided under the second plug. The second chip includes an electrode layer electrically connected to the second plug, a charge storage layer provided on a side face of the electrode layer via a first insulator, and a semiconductor layer provided on a side face of the charge storage layer via a second insulator. The first pad and the second pad are bonded with each other, and the first and second plugs are disposed so that at least a portion of the first plug and at least a portion of the second plug do not overlap with each other in a first direction that is perpendicular to a surface of the substrate.

First Embodiment

Figure 1:
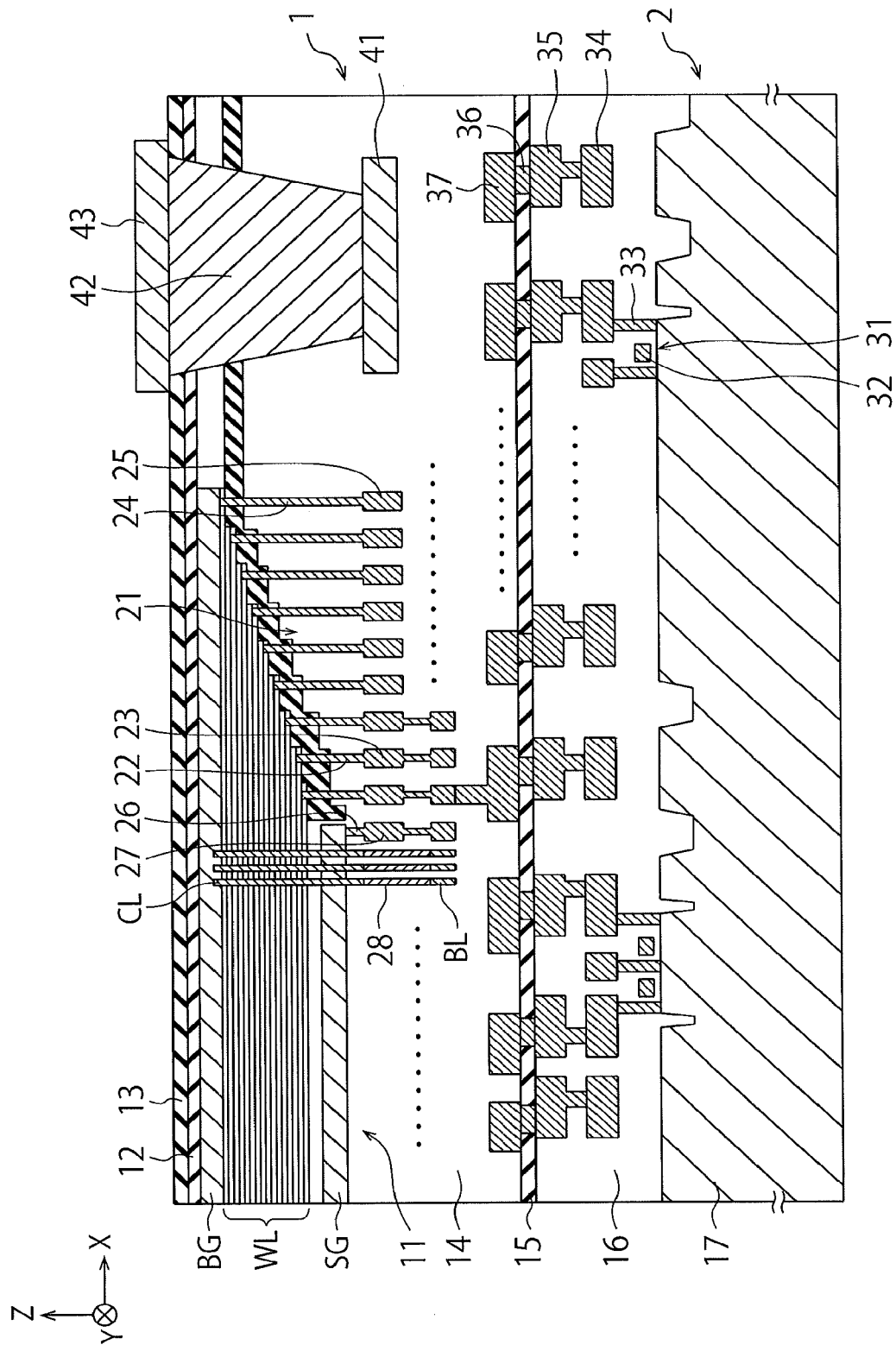
FIG. 1 is a cross-section view illustrating a structure of a semiconductor device in a first embodiment.

FIG. 1 is a cross-section view illustrating a structure of a semiconductor device in a first embodiment. The semiconductor device in FIG. 1 is a three-dimensional memory in which an array chip 1 and a circuit chip 2 are pasted.

The array chip 1 includes a memory cell array 11 including a plurality of memory cells, an insulating layer 12 (for example, a silicon nitride film) on the memory cell array 11, an insulating layer 13 (for example, a silicon oxide film) on the insulating layer 12, and an inter layer dielectric 14 under the memory cell array 11.

The circuit chip 2 is provided under the array chip 1 via the insulating layer 15. The circuit chip 2 includes an inter layer dielectric 16 and a substrate 17 under the inter layer dielectric 16. The substrate 17 is, for example, a semiconductor substrate such as a silicon substrate. FIG. 1 illustrates an X direction and a Y direction which are parallel to a surface of the substrate 17 and which are perpendicular to each other, and a Z direction which is perpendicular to the surface of the substrate 17. In the present specification, while a +Z direction is handled as an upward direction, and a −Z direction is handled as a downward direction, the −Z direction may match a gravity direction or does not have to match the gravity direction. The Z direction is an example of a first direction.

The array chip 1 includes a plurality of word lines WL and a back gate BG and a selector gate SG as an electrode layer in the memory cell array 11. FIG. 1 illustrates a step-like structure portion 21 of the memory cell array 11. As illustrated in FIG. 1, each word line WL is electrically connected to a word line layer 23 via a contact plug 22, the back gate BG is electrically connected to a back gate line layer 25 via a contact plug 24, and the selector gate SG is electrically connected to a selector gate line layer 27 via a contact plug 26. A columnar portion CL which pierces through the word lines WL, the back gate BG and the selector gate SG is electrically connected to bit lines BL via plugs 28.

The circuit chip 2 includes a plurality of transistors 31. Each transistor 31 includes a gate electrode 32 provided on the substrate 17 via a gate insulator, and a source diffusion layer and a drain diffusion layer which are not illustrated and which are provided in the substrate 17. The circuit chip 2 further includes a plurality of plugs 33 provided on the source diffusion layers or the drain diffusion layers of the transistors 31, an interconnect layer 34 including a plurality of interconnects and provided on these plugs 33, and an interconnect layer 35 including a plurality of interconnects and provided on the interconnect layer 34. A plurality of metal pads 36 provided in the insulating layer 15 are provided on the interconnect layer 35. The array chip 1 includes an interconnect layer 37 including a plurality of interconnects and provided on these metal pads 36. Each word line WL of the present embodiment is electrically connected to the interconnect layer 37.

Details of structures of the interconnect layer 35, the metal pads 36 and the interconnect layer 37 will be described later with reference to FIGS. 4A and 4B, or the like. The interconnect layer 35 is an example of a first interconnect layer. The metal pads 36 are examples of a first pad and a second pad. The interconnect layer 37 is an example of a second interconnect layer.

The array chip 1 further includes a pad 41 electrically connected to the interconnect layer 37 via a via plug which is not illustrated, an external connection electrode 42 provided on the pad 41, and an external connection pad 43 provided on the external connection electrode 42. The external connection pad can be connected to a mounted substrate or other apparatuses via a solder ball, a metal bump, a bonding wire, or the like.

Figure 2:
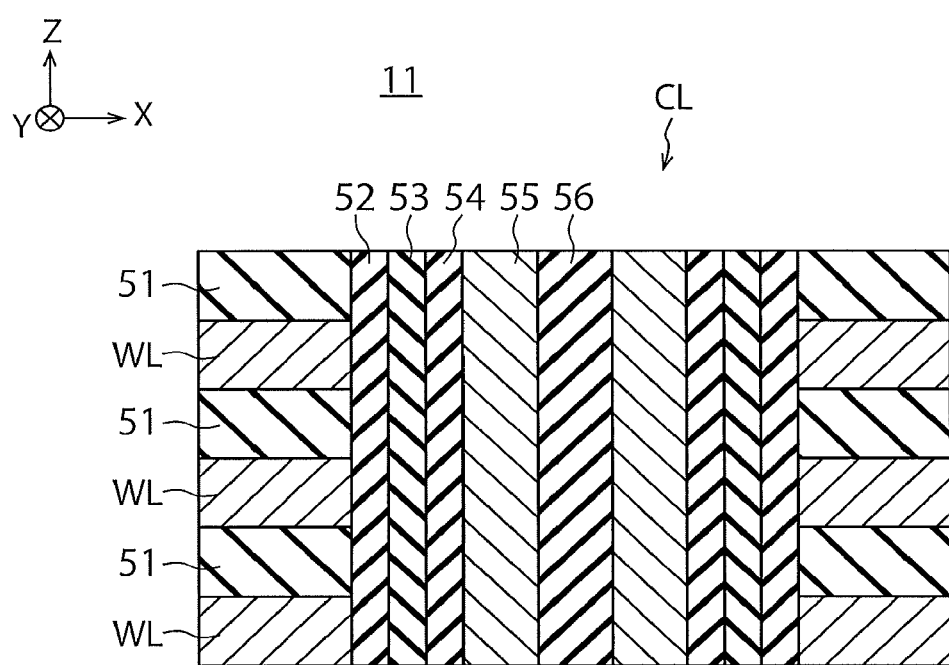
FIG. 2 is a cross-section view illustrating a structure of a columnar portion in the first embodiment.

FIG. 2 is a cross-section view illustrating a structure of a columnar portion CL in the first embodiment.

As illustrated in FIG. 2, the memory cell array 11 includes a plurality of word lines WL and a plurality of insulating layers 51 which are alternately laminated on the inter layer dielectric 14. Each word line WL is, for example, a W (tungsten) layer. Each insulating layer 51 is, for example, a silicon oxide film.

The columnar portion CL includes a block insulator 52 which is an example of a first insulator, a charge storage layer 53, a tunnel insulator 54 which is an example of a second insulator, a channel semiconductor layer 55 and a core insulator 56. The charge storage layer 53, which is, for example, a silicon nitride film, is formed on a side face of the word lines WL and the insulating layer 51 via the block insulator 52. The channel semiconductor layer 55, which is, for example, a silicon layer, is formed on a side face of the charge storage layer 53 via the tunnel insulator 54. The block insulator 52, the tunnel insulator 54 and the core insulator 56 are, for example, a silicon oxide film and a metal insulator.

Figure 3:
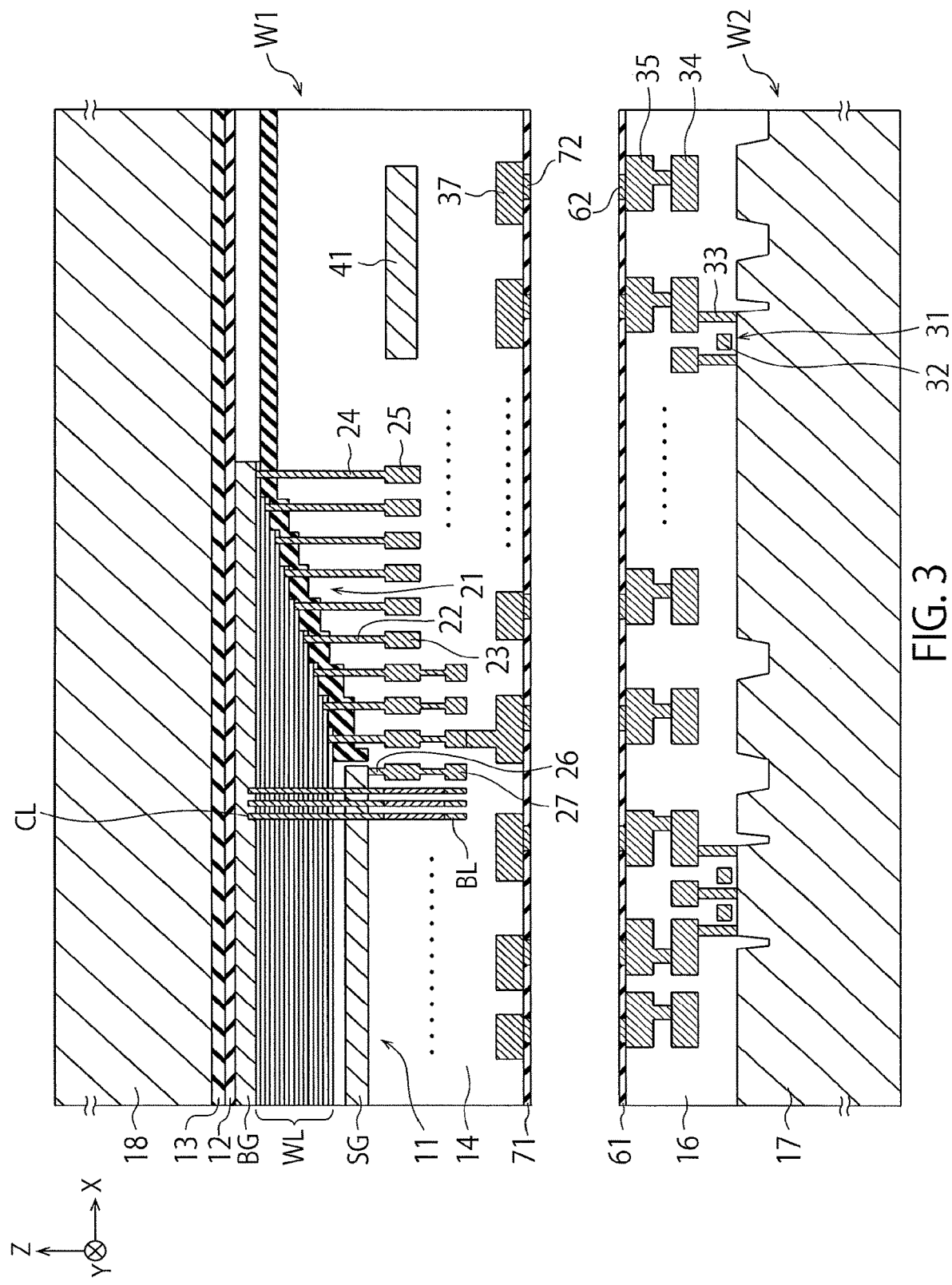
FIG. 3 is a cross-section view illustrating a method of manufacturing the semiconductor device in the first embodiment.

FIG. 3 is a cross-section view illustrating a method of manufacturing the semiconductor device in the first embodiment.

FIG. 3 illustrates an array wafer W1 including a plurality of array chips 1, and a circuit wafer W2 including a plurality of circuit chips 2. FIG. 3 further illustrates a first insulating layer 61 and a plurality of first metal pads 62 provided on an upper face of the circuit wafer W2, and a second insulating layer 71 and a plurality of second metal pads 72 provided on a lower face of the array wafer W1. Each of the first metal pads 62 is provided on an upper face of the interconnect layer 35, and each of the second metal pads 72 is provided on a lower face of the interconnect layer 37. Further, the array wafer W1 includes a substrate 18 on the insulating layer 13.

While, in FIG. 3, the first insulating layer 61 is formed on an upper face of the inter layer dielectric 16, the first insulating layer 61 may be included in and integrated with the inter layer dielectric 16. In a similar manner, while, in FIG. 3, the second insulating layer 71 is formed on a lower face of the inter layer dielectric 14, the second insulating layer 71 may be included in and integrated with the inter layer dielectric 14.

First, the array wafer W1 and the circuit wafer W2 are pasted with mechanical pressure. By this means, the first insulating layer 61 adheres to the second insulating layer 71, so that the insulating layer 15 is formed. Then, the array wafer W1 and the circuit wafer W2 are annealed at 400° C. By this means, the first metal pad 62 is bonded to the second metal pad 72, so that a plurality of metal pads 36 are formed.

Subsequently, the substrate 18 is removed through CMP (Chemical Mechanical Polishing) or wet etching, and the array wafer W1 and the circuit wafer W2 are cut into a plurality of chips. In this manner, the semiconductor device in FIG. 1 is manufactured. The external connection electrode 42 and the external connection pad 43 are formed on the pad 41, for example, after the substrate 18 is removed.

FIGS. 4A and 4B are a cross-section view and a plan view for explaining a structure of the semiconductor device in the first embodiment. FIG. 4A is a plan view illustrating a structure in the vicinity of the insulating layer 15 and the metal pad 36, and FIG. 4B is a cross-section view along a line A-A' in FIG. 4A.

The semiconductor device of the present embodiment includes a first metal pad 62, a first via plug 63, a first interconnect 64 and a first interconnect 65 which are provided in the circuit chip 2, and a second metal pad 72, a second via plug 73 and a second interconnect 74 which are provided in the array chip 1.

A reference numeral A1 indicates a thickness of the first metal pad 62, and a reference numeral B1 indicates a thickness of the first via plug 63. Therefore, A1+B1 corresponds to a total thickness of the first metal pad 62 and the first via plug 63. A reference numeral A2 indicates a thickness of the second metal pad 72, and a reference numeral B2 indicates a thickness of the second via plug 73. Therefore, A2+B2 corresponds to a total thickness of the second metal pad 72 and the second via plug 73.

The first interconnects 64 and 65 are interconnects included in the interconnect layer 35, and, in the present embodiment, extend in the Y direction in the vicinity of the metal pad 36. The interconnect layer 35 is, for example, a W layer. The first interconnect 64 is, for example, electrically connected to a source diffusion layer or a drain diffusion layer of one of the transistors 31.

The first via plug 63 is provided on the first interconnect 64 and electrically connected to the first interconnect 64. The first via plug 63 is, for example a Cu (copper) plug. While a planar shape of the first via plug 63 in the present embodiment is a circle, the first via plug 63 may have other shapes. The thickness B1 of the first via plug 63 is, for example, equal to or greater than twice as thick as the thickness A1 of the first metal pad 62 (B1≥2×A1).

The first metal pad 62 is provided on the first via plug 63, and electrically connected to the first via plug 63. The first metal pad 62 is, for example, a Cu pad. While a planar shape of the first metal pad 62 of the present embodiment is a rectangle having two sides parallel in the X direction and two sides parallel in the Y direction, the first metal pad 62 may have other shapes.

The second metal pad 72 is provided on the first metal pad 62 and electrically connected to the first metal pad 62. The second metal pad 72 is, for example, a Cu pad. While a planar shape of the second metal pad 72 of the present embodiment is a rectangle having two sides parallel in the X direction and two sides parallel in the Y direction, the second metal pad 72 may have other shapes. In the present embodiment, areas of an upper face and a lower face of the second metal pad 72 are set at substantially the same values as areas of an upper face and a lower face of the first metal pad 62.

The second via plug 73 is provided on the second metal pad 72 and electrically connected to the second metal pad 72. The second via plug 73 is, for example, a Cu plug. While a planar shape of the second via plug 73 of the present embodiment is a circle, the second via plug 73 may have other shapes. The thickness B2 of the second via plug 73 is, for example, equal to or greater than twice as thick as the thickness A2 of the second metal pad 72 (B2≥2×A2).

The second interconnect 74 is an interconnect included in the interconnect layer 37 and, in the present embodiment, extends in the X direction in the vicinity of the metal pad 36. The interconnect layer 37 is, for example, a W layer. The second interconnect 74 is, for example, electrically connected to one of the word lines WL.

The first metal pad 62 and the second metal pad 72 may be metal pads other than Cu pads if the first metal pad 62 can be bonded to the second metal pad 72 through a pasting process. Such metal pads are, for example, Ni (nickel) pads. Further, while the first and the second via plugs 63 and 73 are formed with the same material as the first and the second metal pads 62 and 72 in the present embodiment, the first and the second via plugs 63 and 73 may be formed with a material different from the material of the first and the second metal pads 62 and 72.

FIG. 4B illustrates a projecting portion 62a projecting from an upper face of the first metal pad 62 and a projecting portion 72a projecting from a lower face of the second metal pad 72. The first and the second metal pads 62 and 72 expand when the array wafer W1 and the circuit wafer W2 are annealed. According to experiments, the first metal pad 62 is likely to expand above the first via plug 63, and a degree of expansion of the first metal pad 62 becomes larger as the total thickness of A1+B1 becomes thicker. In a similar manner, the second metal pad 72 is likely to expand below the second via plug 73, and a degree of expansion of the second metal pad 72 becomes larger as the total thickness A2+B2 becomes thicker.

Therefore, if the array wafer W1 and the circuit wafer W2 are annealed, the projecting portion 62a projects from the upper face of the first metal pad 62, and the projecting portion 72a projects from the lower face of the second metal pad 72. In the present embodiment, the projecting portion 62a of the first metal pad 62 is bonded to the second metal pad 72, and the projecting portion 72a of the second metal pad 72 is bonded to the first metal pad 62. As a result, the first metal pad 62 and the second metal pad 72 are electrically connected to each other via the projecting portion 62a and the projecting portion 72a.

FIG. 4A illustrates positional relationship between the first via plug 63 and the second via plug 73. The first and the second via plugs 63 and 73 of the present embodiment are disposed so that the first via plug 63 and the second via plug 73 do not overlap with each other in the Z direction. As a result, if areas of the projecting portions 62a and 72a in the case where the projecting portions 62a and 72a do not contact each other are respectively expressed as S1 and S2, an area where the first metal pad 62 is bonded to the second metal pad 72 becomes substantially S1+S2. Therefore, according to the present embodiment, it is possible to secure a wider area where the first metal pad 62 is bonded to the second metal pad 72, so that it is possible to reduce resistance at a portion where the first metal pad 62 is bonded to the second metal pad 72.

As illustrated in FIG. 4A, the second via plug 73 is disposed in a direction between the X direction and the Y direction with respect to the first via plug 63 instead of being disposed in the X direction or in the Y direction of the first via plug 63. Such arrangement has an advantage that the first via plug 63 and the second via plug 73 can be easily disposed so that the first via plug 63 does not overlap with the second via plug 73 in the Z direction.

The first metal pad 62 and the second metal pad 72 of the present embodiment are disposed so that the first metal pad 62 completely overlaps with the second metal pad 72 in the Z direction. However, there is a case where the first metal pad 62 and the second metal pad 72 are disposed such that the first metal pad 62 does not completely overlap with the second metal pad 72 in the Z direction due to misalignment when the array wafer W1 is pasted to the circuit wafer W2. In the present embodiment, when layout of the first and the second via plugs 63 and 73 is designed, it is preferable that the layout is designed so that the first via plug 63 does not overlap with the second via plug 73 in the Z direction both in the former case and in the latter case. This can be realized by, for example, securing a sufficient distance between the first via plug 63 and the second via plug 73 when the layout of the first and the second via plugs 63 and 73 is designed. The above-described points can be also applied to the first via plug 63 and a dummy via plug 75 which will be described later.

Figure 5A:
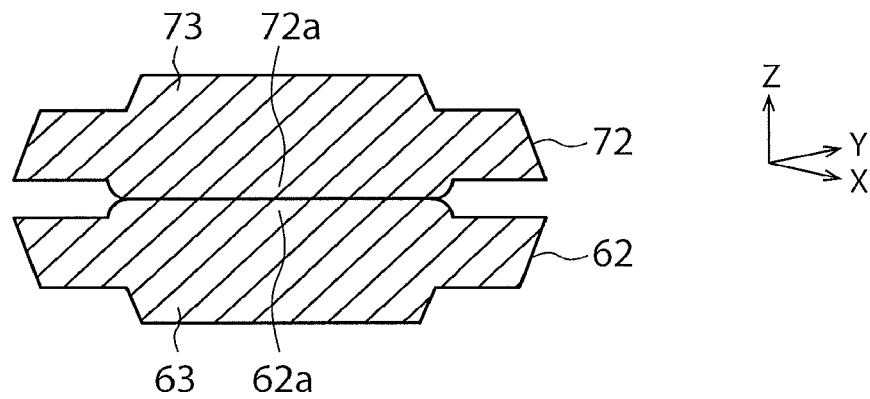
FIGS. 5A to 5C are cross-sections view for explaining a problem of a semiconductor device in a comparative example of the first embodiment.
Figure 5B:
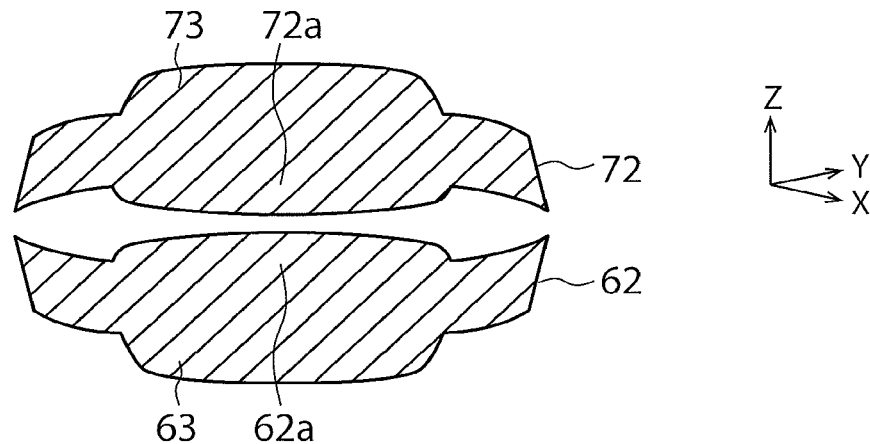
Figure 5C:
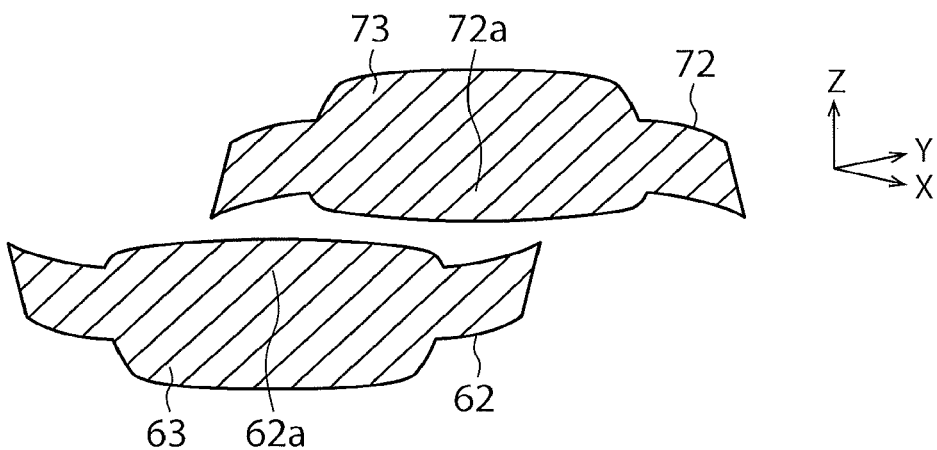

FIGS. 5A to 5C are cross-section views for explaining problems of a semiconductor device in a comparative example of the first embodiment.

FIG. 5A illustrates the first metal pad 62 and the second metal pad 72 bonded with the projecting portions 62a and 72a. However, it should be noted that the first via plug 63 and the second via plug 73 are thin.

FIG. 5B schematically illustrates aspect where the first metal pad 62 and the second metal pad 72 deform (dishing) upon annealing. In this case, there is a possibility that the first metal pad 62 is not bonded to the second metal pad 72.

FIG. 5C illustrates aspect where there occurs misalignment between the first metal pad 62 and the second metal pad 72. In this case, there is a further higher possibility that the first metal pad 62 is not bonded to the second metal pad 72.

It is considered that these problems are both caused by insufficient expansion of the first and the second metal pads 62 and 72. To address these problems, there is, for example, a possible way of making the first metal pad 62 and the second metal pad 72 thicker. However, if the first metal pad 62 and the second metal pad 72 are made thicker, problems occur that cost for forming the first metal pad 62 and the second metal pad 72 increases, and characteristics vary among a plurality of first metal pads 62 and among a plurality of second metal pads 72.

Therefore, in the present embodiment, the first via plug 63 and the second via plug 73 are made thicker. Specifically, the thickness B1 of the first via plug 63 is set at equal to or greater than twice as thick as the thickness A1 of the first metal pad 62, and the thickness B2 of the second via plug 73 is set at equal to or greater than twice as thick as the thickness A2 of the second metal pad 72. By this means, it is possible to increase the thicknesses of the projecting portions 62a and 72a, so that it is possible to bond the first metal pad 62 to the second metal pad 72 also in the cases in FIGS. 5B and 5C.

Further, in the present embodiment, the first via plug 63 and the second via plug 73 are disposed so as not to overlap with each other in the Z direction. By this means, it is possible to reduce resistance at a portion where the first metal pad 62 is bonded to the second metal pad 72. In the present embodiment, the projecting portions 62a and 72a can be made sufficiently thick so that the first metal pad 62 is bonded to the second metal pad 72 also in the cases in FIGS. 5B and 5C. This can be realized by making the first via plug 63 and the second via plug 73 thicker as described above.

Figure 6:
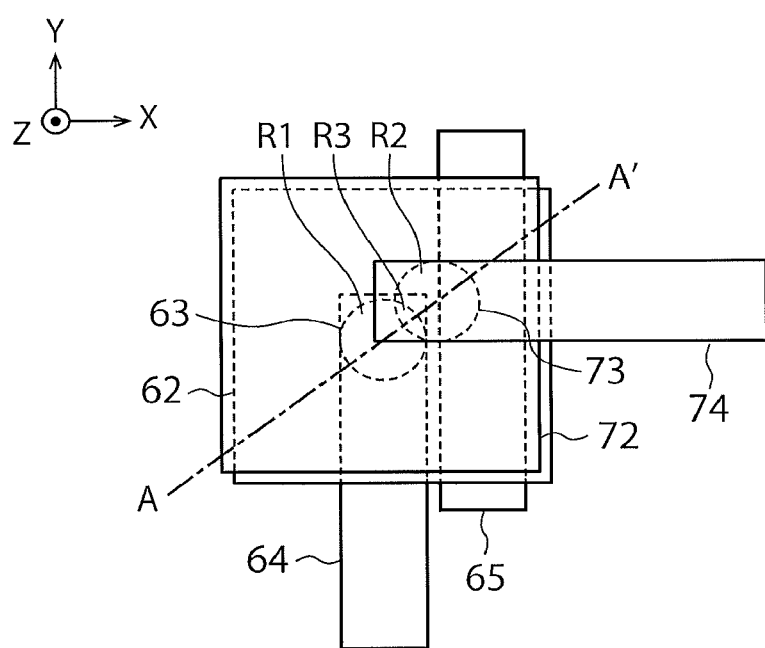
FIG. 6 is a plan view for explaining a structure of a semiconductor device in a modified example of the first embodiment.

FIG. 6 is a plan view for explaining a structure of a semiconductor device in a modified example of the first embodiment.

The first and the second via plugs 63 and 73 in FIG. 4A are disposed so that the first via plug 63 and the second via plug 73 do not overlap with each other in the Z direction. Meanwhile, the first and the second via plugs 63 and 73 in FIG. 6 are disposed so that a portion of the first via plug 63 and a portion of the second via plug 73 overlap with each other in the Z direction. Reference numerals R1, R2 and R3 respectively indicate a non-overlapping portion of the first via plug 63, a non-overlapping portion of the second via plug 73 and an overlapping portion of the first via plug 63 and the second via plug 73.

According to the present modified example, even in the case where the first via plug 63 overlaps with the second via plug 73, it is possible to reduce resistance at a portion where the first metal pad 62 is bonded to the second metal pad 72 by making the overlapping portion R3 smaller. An area of the overlapping portion R3 is, for example, equal to or less than ⅓ of an area of the non-overlapping portion R1 or R2, and is preferably equal to or less than ¼ of the non-overlapping portion R1 or R2.

As described above, the first and the second via plugs 63 and 73 of the present embodiment are disposed so that the first via plug 63 and the second via plug 73 do not overlap with each other in the Z direction or disposed so that a portion of the first via plug 63 and a portion of the second via plug 73 overlap with each other in the Z direction. In other words, the first and the second via plugs 63 and 73 of the present embodiment are disposed so that at least a portion of the first via plug 63 and at least a portion of the second via plug 73 do not overlap with each other in the Z direction. Therefore, according to the present embodiment, it is possible to reduce resistance at a portion where the first metal pad 62 is bonded to the second metal pad 72, and it is possible to suppress poor connection of the first metal pad 62 and the second metal pad 72, so that it is possible to appropriately bond the first metal pad 62 to the second metal pad 72.

The first metal pad 62 and the second metal pad 72 may be bonded to each other also on a pad surface other than the projecting portions 62a and 72a, as well as being bonded to each other at the projecting portions 62a and 72a. By this means, it is possible to further reduce resistance at a portion where the first metal pad 62 is bonded to the second metal pad 72. In this case, it can be considered that a cavity is formed at a portion which is between the first metal pad 62 and the second metal pad 72 and which is a region except the projecting portions 62a and 72a. For example, in the case where the first via plug 63 is distant from the second via plug 73 when seen from the Z direction, it can be considered that a cavity is formed between the projecting portion 62a and the projecting portion 72a.

Second Embodiment

FIGS. 7A and 7B are a cross-section view and a plan view for explaining a structure of a semiconductor device in a second embodiment. FIG. 7A is a plan view illustrating a structure in the vicinity of the insulating layer 15 and the metal pad 36, and FIG. 7B is a cross-section view along a line A-A' in FIG. 7A.

The semiconductor device of the present embodiment includes a dummy via plug 75 in addition to the components illustrated in FIGS. 4A and 4B. The dummy via plug 75, which is an example of a third plug, is provided in the array chip 1. A reference numeral C2 indicates a thickness of the dummy via plug 75. Therefore, A2+C2 corresponds to a total thickness of the second metal pad 72 and the dummy via plug 75.

The dummy via plug 75 is provided on the second metal pad 72 and is electrically connected to the second metal pad 72 in a similar manner to the second via plug 73. The dummy via plug 75 is, for example, formed with Cu (copper). While a planar shape of the dummy via plug 75 in the present embodiment is a circle, the dummy via plug 75 may have other shapes. The thickness C2 of the dummy via plug 75 is, for example, equal to or greater than twice as thick as the thickness A2 of the second metal pad 72 (C2≥2×A2).

To be exact, the dummy via plug 75 of the present embodiment is disposed in the vicinity of an upper left corner on an upper face of the second metal pad 72 as illustrated in FIG. 7A. However, it should be noted that, in FIG. 7B, to facilitate visualization of the drawing, the dummy via plug 75 is illustrated at a position different from that in FIG. 7A.

The second via plug 73 contacts the second interconnect 74 extending in the interconnect layer 37, and functions as a plug for the second interconnect 74. On the other hand, the dummy via plug 75 is disposed so as not to contact each interconnect extending in the interconnect layer 37, and does not function as a plug for each interconnect extending in the interconnect layer 37. That is, the dummy via plug 75 is in a floating state which means that the dummy via plug 75 is not in direct conduction with the interconnect layer 37.

While the dummy via plug 75 is formed with the same material as that of the second metal pad 72 in the present embodiment, the dummy via plug 75 may be formed with a material different from that of the second metal pad 72.

FIG. 7B illustrates a projecting portion 72b which projects from a lower face of the second metal pad 72. When the array wafer W1 and the circuit wafer W2 are annealed, the second metal pad 72 easily expands below the dummy via plug 75, and as the total thickness A2+C2 becomes thicker, a degree of expansion of the second metal pad 72 increases.

Therefore, if the array wafer W1 and the circuit wafer W2 are annealed, the projecting portion 72b projects from the lower face of the second metal pad 72. In the present embodiment, the projecting portion 62a of the first metal pad 62 is bonded to the second metal pad 72, and the projecting portions 72a and 72b of the second metal pad 72 are bonded to the first metal pad 62. As a result, the first metal pad 62 and the second metal pad 72 are electrically connected to each other via the projecting portion 62a, the projecting portion 72a and the projecting portion 72b.

FIG. 7A illustrates positional relationship among the first via plug 63, the second via plug 73 and the dummy via plug 75. The first via plug 63 and the dummy via plug 75 of the present embodiment are disposed so that the first via plug 63 and the dummy via plug 75 do not overlap with each other in the Z direction. As a result, if areas of the projecting portions 62a, 72a and 72b in the case where the projecting portions 62a, 72a and 72b do not contact one another are respectively expressed as S1, S2 and S3, an area where the first metal pad 62 is bonded to the second metal pad 72 becomes substantially S1+S2+S3. Therefore, according to the present embodiment, it is possible to secure a wider area where the first metal pad 62 is bonded to the second metal pad 72, so that it is possible to further reduce resistance at a portion where the first metal pad 62 is bonded to the second metal pad 72.

The first via plug 63 and the dummy via plug 75 may be disposed so that a portion of the first via plug 63 and a portion of the dummy via plug 75 overlap with each other in the Z direction in a similar manner to the case in FIG. 6. In this case, by making a portion where the first via plug 63 overlaps with the dummy via plug 75 smaller, it becomes possible to reduce resistance at a portion where the first metal pad 62 is bonded to the second metal pad 72.

Figure 8:
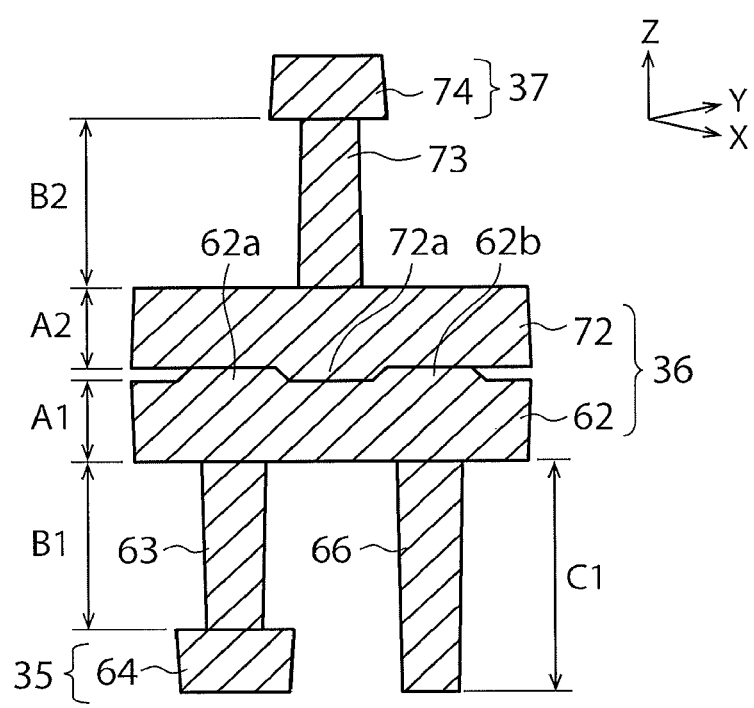
FIG. 8 is a cross-section view for explaining a structure of a semiconductor device in a modified example of the second embodiment.

FIG. 8 is a cross-section view for explaining a structure of a semiconductor device in a modified example of the second embodiment.

The semiconductor device in the present modified example includes a dummy via plug 66 in place of the dummy via plug 75. The dummy via plug 66, which is an example of a fourth plug, is provided in the circuit chip 2. A reference numeral C1 indicates a thickness of the dummy via plug 66. Therefore, A1+C1 corresponds to a total thickness of the first metal pad 62 and the dummy via plug 66.

Details of the dummy via plug 66 are substantially the same as details of the dummy via plug 75. The dummy via plug 66 is provided under the first metal pad 62 and electrically connected to the first metal pad 62 in a similar manner to the first via plug 63. The thickness C1 of the dummy via plug 66 is, for example, equal to or greater than twice as thick as the thickness A1 of the first metal pad 62 (C1≥2×A1).

The first via plug 63 contacts the first interconnect 64 extending in the interconnect layer 35 and functions as a plug for the first interconnect 64. On the other hand, the dummy via plug 66 is disposed so as not to contact each interconnect extending in the interconnect layer 35 and does not function as a plug for each interconnect extending in the interconnect layer 35. That is, the dummy via plug 66 is in a floating state which means that the dummy via plug 66 is not in direct conduction with the interconnect layer 35.

When the array wafer W1 and the circuit wafer W2 are annealed, the first metal pad 62 easily expands above the dummy via plug 66, and, as the total thickness A1+C1 becomes thicker, a degree of expansion of the first metal pad 62 increases. Therefore, if the array wafer W1 and the circuit waver W2 are annealed, the projecting portion 62b projects from an upper face of the first metal pad 62. The first metal pad 62 and the second metal pad 72 in the present modified example are electrically connected to each other via the projecting portion 62a, the projecting portion 72a and the projecting portion 62b.

The second via plug 73 and the dummy via plug 66 in the present modified example are disposed so that the second via plug 73 and the dummy via plug 66 do not overlap with each other in the Z direction. Therefore, according to the present modified example, it is possible to secure a wider area where the first metal pad 62 is bonded to the second metal pad 72, so that it is possible to further reduce resistance at a portion where the first metal pad 62 is bonded to the second metal pad 72. The dummy via plug 66 of the present embodiment is, for example, disposed in the vicinity of a lower right corner on a lower face of the first metal pad 62.

The second via plug 73 and the dummy via plug 66 may be disposed so that a portion of the second via plug 73 and a portion of the dummy via plug 66 overlap with each other in the Z direction in a similar manner to the case in FIG. 6. In this case, by making a portion where the second via plug 73 overlaps with the dummy via plug 66 smaller, it is possible to reduce resistance at a portion where the first metal pad 62 is bonded to the second metal pad 72.

As described above, the first via plug 63 and the dummy via plug 75 of the present embodiment are disposed so that the first via plug 63 and the dummy via plug 75 do not overlap with each other in the Z direction, or disposed so that a portion of the first via plug 63 and a portion of the dummy via plug 75 overlap with each other in the Z direction.

In other words, the first via plug 63 and the dummy via plug 75 of the present embodiment are disposed so that at least of the first via plug 63 and at least of the dummy via plug 75 do not overlap with each other in the Z direction. Therefore, according to the present embodiment, it becomes possible to bond the first metal pad 62 to the second metal pad 72 further appropriately. This will similarly apply to the second via plug 73 and the dummy via plug 66 in the above-described modified example.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first chip including:
   a substrate,
   a first interconnect layer provided above the substrate,
   a first pad provided above the first interconnect layer; and
   a first plug extending in a first direction crossing a surface of the substrate and connecting the first interconnect layer and the first pad; and
   a second chip including:
   a second interconnect layer,
   a second pad provided under the second interconnect layer,
   a second plug extending in the first direction and connecting the second interconnect layer and the second pad,
   a memory cell array electrically connected to the second interconnect layer, and
   a bit line provided between the second interconnect layer and the memory cell array in the first direction, wherein
   the first plug shifts with respect to the second plug in a plane crossing the first direction,
   the first pad includes a first portion overlapping with the first plug in the first direction, and a second portion other than the first portion,
   the second pad includes a third portion overlapping with the second plug in the first direction, and a fourth portion other than the third portion,
   the first portion of the first pad is all bonded with the second pad,
   the third portion of the second pad is all bonded with the first pad, and
   the second portion of the first pad surrounds the first portion of the first pad and has a closed ring-shape, when viewed from the first direction, and
   a cavity is provided between the second portion of the first pad and a part of the second pad.

2. The device of claim 1, wherein
   a material of the first plug is identical with a material of the first pad and different from
   a material of the first interconnect layer, and
   a material of the second plug is identical with a material of the second pad and different from a material of the second interconnect layer.

3. The device of claim 1, wherein the first pad has a shape of a rectangular parallelepiped.

4. The device of claim 1, wherein the second portion of the first pad is not in contact with the part of the second pad.

* * * * *